United States Patent
Aoki et al.

(10) Patent No.: US 8,889,449 B2
(45) Date of Patent: Nov. 18, 2014

(54) GROUP III NITRIDE SEMICONDUCTOR LIGHT-EMITTING ELEMENT AND METHOD FOR PRODUCING THE SAME

(71) Applicant: Toyoda Gosei Co., Ltd., Kiyosu (JP)

(72) Inventors: Masato Aoki, Kiyosu (JP); Koichi Goshonoo, Kiyosu (JP); Satoshi Wada, Kiyosu (JP)

(73) Assignee: Toyoda Gosei Co., Ltd, Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/770,965

(22) Filed: Feb. 19, 2013

(65) Prior Publication Data

US 2013/0240945 A1    Sep. 19, 2013

(30) Foreign Application Priority Data

Mar. 19, 2012  (JP) ................. 2012-061420

(51) Int. Cl.
| | |
|---|---|
| *H01L 21/00* | (2006.01) |
| *H01L 33/40* | (2010.01) |
| *H01L 33/00* | (2010.01) |
| *H01L 33/14* | (2010.01) |
| *H01L 33/42* | (2010.01) |

(52) U.S. Cl.
CPC ........... *H01L 33/0075* (2013.01); *H01L 33/40* (2013.01); *H01L 33/007* (2013.01); *H01L 2933/0016* (2013.01); *H01L 33/0095* (2013.01); *H01L 33/145* (2013.01); *H01L 33/42* (2013.01)
USPC ................. 438/46; 438/22; 438/69; 257/76; 257/E33.062

(58) Field of Classification Search
CPC ........................ H01L 33/0075; H01L 33/145
USPC ............. 438/22, 34, 45, 46, 48, 69, 82, 767; 257/98, 99
See application file for complete search history.

(56) References Cited

U.S. PATENT DOCUMENTS

| | | | |
|---|---|---|---|
| 6,291,840 B1 | 9/2001 | Uemura et al. | |
| 8,597,962 B2 * | 12/2013 | Yu et al. ........................ | 438/22 |
| 2001/0018226 A1 | 8/2001 | Uemura et al. | |
| 2002/0072204 A1 | 6/2002 | Uemura et al. | |
| 2005/0276911 A1 * | 12/2005 | Chen et al. ................... | 427/96.1 |
| 2007/0018183 A1 * | 1/2007 | Denbaars et al. ............. | 257/98 |
| 2010/0072508 A1 * | 3/2010 | Kamiya et al. ................ | 257/99 |

FOREIGN PATENT DOCUMENTS

| | | |
|---|---|---|
| EP | 2498303 A1 * | 9/2012 |
| JP | 10-229219 A | 8/1998 |
| JP | 2010-080542 A | 4/2010 |

* cited by examiner

*Primary Examiner* — Reema Patel
*Assistant Examiner* — Syed Gheyas

(57) ABSTRACT

A method for producing a group III nitride semiconductor light-emitting device, by which a non-light-emitting region is easily formed, is disclosed. Mg is activated to convert a p-type layer into p-type, and a p-electrode is then formed on the p-type layer. An Ag paste is applied to a region on the p-electrode and overlapping an n-electrode formed in a subsequent step. Heat treatment is conducted to solidify the Ag paste, thereby forming an Ag paste solidified body. By this, a region overlapping the Ag paste solidified body in a planar view, of the p-type layer converts into a region having high resistance, and a high resistance region is formed. As a result, a region overlapping the high resistance region in a planar view, of a light-emitting layer becomes a non-light-emitting region.

20 Claims, 7 Drawing Sheets

GROUP III NITRIDE SEMICONDUCTOR LIGHT-EMITTING ELEMENT AND METHOD FOR PRODUCING THE SAME

BACKGROUND OF THE INVENTION

1. Field of the Invention

The present invention relates to a group III nitride semiconductor light-emitting device having a non-light-emitting region in a light-emitting layer, and a method for producing the same.

2. Description of the Related Art

In a face-up-type group III nitride semiconductor light-emitting device, light emitted from a light-emitting layer positioned just below a p-pad electrode is reflected and absorbed by the p-pad electrode. As a technology to inhibit this, a technology that inhibits light emission by blocking off that current flow to a region overlapping the p-pad electrode in a planar view (the case of viewing from a direction vertical to a principal surface of the light-emitting layer; therein after the same), of the light-emitting layer, inhibits reflection and absorption of light by the p-pad electrode, and improves light extraction efficiency, is known (JP-A-10-229219 and JP-A-2010-80542).

In JP-A-10-229219, a p-pad electrode is formed by a material containing a metal having reactivity to nitrogen, such as Cr, V, Ti, Nb, Ta or Zr. A p-type layer is reacted with the metal having reactivity to nitrogen in an alloy treatment of the p-pad electrode to form nitrogen vacancies in the p-type layer. A high resistance region in the p-type layer under the p-pad electrode is formed and as a result, current does not flow under the p-pad electrode.

In JP-A-2010-80542, a p-pad electrode comprising Ni/Au is formed on a transparent electrode comprising ITO upper a p-type layer, and heat treatment is conducted at from 500 to 650° C. Contact resistance of a region of the transparent electrode under the p-pad electrode, become high, and as a result, current does not flow under the p-pad electrode.

On the other hand, even in a group III nitride semiconductor light-emitting device having a structure that a p-electrode and an n-electrode are provided up and down to achieve conduction in a longitudinal direction (the direction vertical to a principal surface of a substrate) and having a structure that light is extracted from an n-electrode side using a high reflective metal p-electrode such as Ag (such a device can be produced, for example, using laser lift-off technology or using a conductive substrate such as a GaN substrate as a growth substrate), a technology making a region overlapping an n-electrode in a planar view, of a light-emitting layer to emit light, thereby improving light extraction efficiency is known. In this case, a region just below an n-electrode, of the light-emitting layer does not emit light by methods in which an insulating film is provided between a p-type layer and the p-electrode, a method in which the p-electrode is provided on only a region other than a region just below the n-electrode, or an insulating film is provided on a region just below the n-electrode, and a p-electrode is not provided.

However, the conventional method of forming an insulating layer and providing a non-light-emitting region as described above had the problem that many steps are required, resulting in the increase in production cost. Furthermore, in the methods disclosed in JP-A-10-229219 and JP-A-2010-80542, an electrode material is limited, and the methods could not be applied to the case of using high reflective metal such for Ag as a p-electrode.

SUMMARY OF THE INVENTION

Accordingly, an object of the present invention is to provide a method for producing a group III nitride semiconductor light-emitting device that enables a desired region to form into a non-light-emitting region by a simple method.

A first invention is a method for producing a group III nitride semiconductor light-emitting device having a part of a region of a light-emitting layer as a non-light-emitting region, the method comprising:

a first step of sequentially growing an n-type layer, a light-emitting layer and a p-type layer comprising a group III nitride semiconductor on a growth substrate;

a second step of activating the p-type layer to p-type activation by heat treatment and then forming a p-contact electrode on the p-type layer;

a third step of applying a metal paste comprising conductive metal particles dispersed in a solvent comprising a material containing hydrogen as a constituent element, to a desired region on the p-contact electrode; and a fourth step of solidifying the metal paste by heat treatment to form a part of a region of the p-type layer into a high resistance region, thereby forming a region overlapping a region having the metal paste applied thereto in a planar view, of the light-emitting layer into a non-light-emitting region.

The non-light-emitting region is a region that does not emit light even by applying forward voltage between a p-electrode and an n-electrode, of the light-emitting layer.

Conductive metal particles mixed and dispersed in a solvent can be used for the metal paste. Average particle size of the metal particles is optional, but metal particles having an average particle size of from 30 to 500 nm are desirably used from the standpoint of ease of agglomeration. Metal particles such as Ag, Cu, and Au can be used. Solvents containing hydrogen as a constituent element can be used, and examples of the solvent that can be used include an epoxy resin, a silicone resin and an aliphatic higher alcohol (such as terpineol, decanol or diol).

The atmosphere of the heat treatment to solidify the metal paste in vacuum, oxygen, or inert gas atmosphere is desirable. Examples of the inert gas include nitrogen, neon, argon, krypton and xenon. The heat treatment can be conducted in a mixed gas atmosphere of oxygen and an inert gas. Heat treatment temperature and time are ranges in which the metal paste solidifies. The heat treatment at a temperature of from 300 to 600° C. for from 5 to 30 minutes is desirable. When the heat treatment temperature and time are within the ranges, the metal paste can be solidified further steadily. The heat treatment pressure from 1 to 50 Pa is desirable. The reason for this is that the solvent can easily evaporate.

Application method of the metal paste can be used for the various printing methods such as screen printing, offset printing and inkjet printing, and methods such as dispenser, spin coating and spraying method.

The metal paste is desirably applied in a thickness of from 0.5 to 2.0 μm. When the thickness is within this range, a high resistance region can further steadily be formed in a region overlapping a metal paste-applied region. Additionally, the metal paste can be solidified further steadily and quickly.

The non-light-emitting region can be utilized to inhibit reflection and absorption of light by an n-electrode in a group III nitride semiconductor light-emitting device having a structure that conduction is achieved in a longitudinal direction and a structure of extracting light from an n-electrode side. Specifically, when a region overlapping the n-electrode in a planar view is formed into a non-light-emitting region, reflection and absorption of light by the n-electrode can be inhibited and light extraction efficiency can be improved. The structure that conduction is achieved in a longitudinal direction and the structure of extracting light from an n-electrode side can be realized by using a technique of removing a growth substrate, such as laser lift-off technique or chemical lift-off technique, as in the second invention, or using a transparent conductive substrate as a growth substrate as in the third invention. A group III nitride semiconductor such as GaN, and a ZnO substrate can be used for the transparent substrate.

The non-light-emitting region can be utilized to inhibit reflection and absorption of light by a p-pad electrode in a face-up-type group III nitride semiconductor light-emitting device. Similarly, light extraction efficiency can be improved The p-contact electrode comprises a conductive material contacting a p-type layer, is a reflecting electrode comprising a high reflective metal such as Ag in a longitudinal-type element structure, and is a transparent electrode comprising a transparent conductive material such as ITO in a face-up-type element structure.

A second invention is the method for producing a group III nitride semiconductor light-emitting device according to the first invention, wherein the p-contact electrode comprises Ag or an Ag alloy, and the method further comprises a fifth step of joining the support and the p-contact electrode and removing the growth substrate using a substrate lift-off method after the fourth step, and a sixth step of forming an n-electrode in a region that is the surface of the n-type layer exposed by removal of the growth substrate and overlaps the region having the metal paste applied thereto in a planar view after the fifth step.

A third invention is the method for producing a group III nitride semiconductor light-emitting device according to the first invention, wherein the growth substrate is a transparent conductive substrate, the p-contact electrode comprises Ag or an Ag alloy, and the method further comprises a seventh step of forming an n-electrode on a region that is a surface at an opposite side of the n-type layer formation side of the growth substrate and overlaps a region having the metal paste applied thereto in a planar view after the fourth step.

A fourth invention is the method for producing a group III nitride semiconductor light-emitting device according to the first invention, wherein the group III nitride semiconductor light-emitting device is a face-up type, the p-contact electrode is a transparent electrode comprising a transparent conductive material, and a metal paste solidified in the fourth step is used as a p-pad electrode.

A fifth invention is that in the first to fourth inventions, the solvent of the metal paste is an epoxy resin, a silicone resin or an aliphatic higher alcohol.

A sixth invention is that in the first to fifth inventions, the metal particles are Ag, Cu or Au.

A seventh invention is that in the first to sixth inventions, the heat treatment of the fourth step is conducted in an oxygen atmosphere, an inert gas atmosphere or a mixed atmosphere of those under a pressure of from 1 to 50 Pa.

An eighth invention is that in the seventh invention, the heat treatment of the fourth step is conducted in an oxygen atmosphere, a nitrogen atmosphere or a mixed atmosphere of those.

A ninth invention is a group III nitride semiconductor light-emitting device comprising a conductive support; a p-electrode comprising Ag or an alloy containing Ag, positioned on the support; a p-type layer, a light-emitting layer, and n-type layer comprising a group III nitride semiconductor, a light-emitting layer and a semiconductor layer as an n-type layer, sequentially positioned on the p-electrode; and an n-electrode positioned on the n-type layer, wherein a region that is a surface at the support side of the p-electrode and overlaps the n-electrode in a planar view has a solidified metal paste that is a solid of a metal paste, and a region overlapping the solidified metal paste in a planar view, of the p-type layer is a high resistance region.

A tenth invention is a group III nitride semiconductor light-emitting devices comprising a transparent conductive substrate; an n-type layer, a light-emitting layer and a p-type layer comprising a group III nitride semiconductor, sequentially positioned on the transparent conductive substrate; a p-electrode comprising Ag or an alloy containing Ag, positioned on the p-type layer; and an n-electrode positioned on a surface at a side opposite the n-type layer side of the transparent conductive substrate, wherein a region on the p-electrode and overlapping the n-electrode in a planar view has a solidified metal paste that is a solid of the metal paste, and a region overlapping the solidified metal paste in a planar view, of the p-type layer is a high resistance region.

An eleventh invention is a face-up-type group III nitride semiconductor light-emitting device comprising a growth substrate; an n-type layer, a light-emitting layer and a p-type layer comprising a group III nitride semiconductor, sequentially positioned on the growth substrate; a semiconductor layer in which a part thereof is etched from the p-type layer side and a surface of the n-type layer is exposed; an n-electrode positioned on the exposed n-type layer; a transparent electrode positioned on the n-type layer; and a p-pad electrode positioned on the transparent electrode, wherein the p-pad electrode is a solidified metal paste, and a region overlapping the p-pad electrode in a planar view, of the p-type layer is a high resistance region.

A twelfth invention is that in the ninth invention or the eleventh invention, the solidified metal paste is obtained by burning a metal paste comprising metal particles comprising Ag, Cu or Au dispersed in a solvent comprising a material containing hydrogen as a constituent element, and then solidifying the same.

According to the present invention, a desired region of the p-type layer can easily be formed into a high resistance region, and a region overlapping the high resistance region in a planar view can be formed into a non-light-emitting region. This is considered to be due to that H (hydrogen) diffuses from the metal paste and is incorporated in the p-type layer, Mg as a p-type impurity is inactivated, and a high resistance region is formed.

DESCRIPTION OF THE PREFERRED EMBODIMENTS

Specific embodiments of the present invention are described below by reference to the drawings, but the invention is not construed as being limited to the examples.

Example 1

Figure 1:
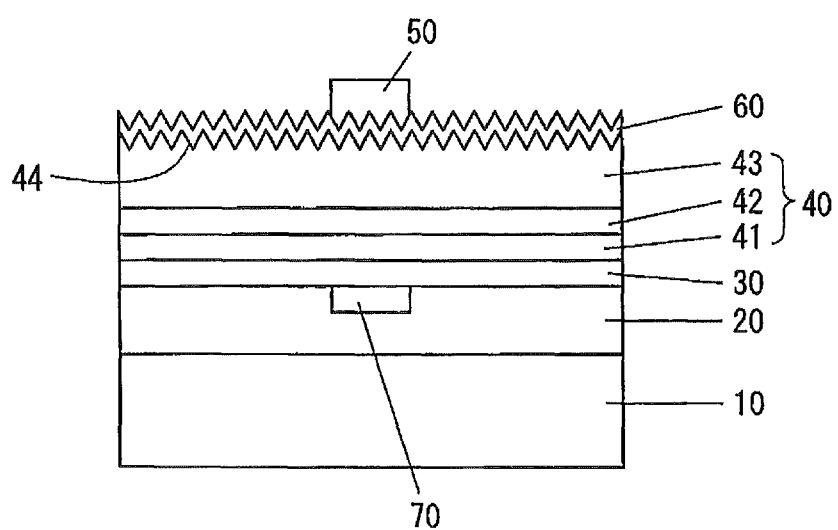
FIG. 1 is a view showing a constitution of the group III nitride semiconductor light-emitting device of Example 1.

FIG. 1 is a view showing a constitution of the group III nitride semiconductor light-emitting device of Example 1. As shown in FIG. 1, the group III nitride semiconductor light-emitting device comprises a conductive support 10, a p-electrode 30 joined to the support 10 with a joining layer 20, and a semiconductor layer 40 comprising a group III nitride semiconductor, positioned on the p-electrode 30. The semiconductor layer 40 has a structure that three layers of a p-type layer 41, a light-emitting layer 42 and an n-type layer 43 are sequentially laminated from the p-electrode 30 side. A transparent electrode 60 is formed on the n-type layer 43 surface (the surface at a side opposite the light-emitting layer 42 side). An n-electrode 50 is contacted with and formed on the n-type layer 43 surface. A region overlapping the n-electrode 50 in a planar view between the P-electrode 30 and the joining layer 20 has an Ag paste solidified body 70 that is a solidified Ag paste.

A conductive substrate comprising Si, GaAs, Cu, Ge, Cu—W or the like can be used for the support 10. A metal eutectic layer such as an Au—Sn layer, an Au—Si layer, an Ag—Sn—Cu layer, an Sn—Bi layer or the like can be used for the joining layer. Although that is not a low melting point metal, an Au layer, an Sn layer, a Cu layer and the like can be used. Instead of joining the support 10 and the p-electrode 30 using a joining layer, a metal layer such as Cu can directly be formed on the p-electrode 30 by plating or sputtering to form the support 10. A low contact resistance metal having high light reflectivity, such as Ag, Rh, Pt, Ru or alloys comprising those metals as a main component, Ni, an Ni alloy, or an Au alloy can be used for the P-electrode 30. The p-electrode 30 may be a composite layer comprising a transparent electrode film such as ITO, ICO (cerium-doped indium oxide) or IZO (zinc-doped indium oxide) and a high reflection metal film (the semiconductor layer 40 contacts with the transparent electrode film). A transparent conductive oxide such as ITO and a metal thin film such as Au can be used for the transparent electrode film.

The p-electrode 30 is formed on the nearly entire area (all region except for device circumferential part) of the p-type layer 41 surface (the surface at the side opposite side of the light-emitting layer 42 side). The Ag paste solidified body 70 is provided in a region on the joining layer 20 side surface of the p-electrode 30 and overlapping the n-electrode 50 in a planar view. The Ag paste solidified body 70 is obtained by burning the Ag paste to agglomerate and solidify Ag particles.

The p-type layer 41, the light-emitting layer 42 and the n-type layer 43, constituting the semiconductor layer 40 can have optional constitution known as the constitution of the conventional group III nitride semiconductor light-emitting device. For example, the p-type layer 41 has the constitution that a p-contact layer comprising Mg-doped GaN and a p-clad layer comprising Mg-doped AlGaN are sequentially laminated from the support 10 side. The light-emitting layer 42 has, for example, an MQW structure in which a barrier layer comprising GaN and a well layer comprising InGaN have repeatedly been laminated. The n-type layer 43 has, for example, a structure in which an n-clad layer comprising GaN and an n-type contact layer comprising Si-doped GaN are sequentially been laminated from the light-emitting layer 42 side.

As described hereinafter, in forming the Ag paste solidified body 70, a high resistance region 41a is formed in a region of the p-type layer 41 overlapping the n-electrode 50 and the Ag paste solidified body 70 in a planar view. As a result, even though forward voltage is applied between the p-electrode 30 and the n-electrode 50, current does not flow a region overlapping the high resistance region 41 in a planar view, of the light-emitting layer 42, and the region becomes a non-light-emitting region 42a. The high resistance region 41a is a higher resistance region than other region of the p-type layer 41 to such an extent that the region overlapping the high resistance region 41 in a planar view, of the light-emitting layer 42 becomes the non-light-emitting region 42a.

Concavo-convex shape 44 is formed on a surface of the n-type layer (the surface at an opposite side of the light-emitting layer 42 side) by wet etching with an aqueous solution of KOH, NaOH, TMAH (tetramethylammonium hydroxide), phosphoric acid or the like. The concavo-convex shape 44 comprises many fine pyramids, and a side surface of the pyramid has an angle of about 60° to the principal surface of the device. The concavo-convex shape 44 improves light extraction efficiency. Formation of the concavo-convex shape 44 is not always necessary, and the surface of the n-type layer 43 may be flat without forming the concavo-convex shape 44.

The transparent electrode 60 is formed on the entire surface of the n-type layer 43 having the concavo-convex shape 44. A transparent conductive oxide, a metal thin film, an organic transparent conductive material and the like can be used for the transparent electrode 60. Examples of the transparent conductive oxide include ITO (indium-tin oxide), ICO (cerium-doped indium oxide) and IZO (zinc-doped indium oxide). Example of the metal thin film includes Au.

The n-electrode 50 is positioned on the transparent electrode 60. Furthermore, the n-electrode 50 is positioned on a region overlapping the Ag paste solidified body 70 in a planar view, that is, a region overlapping the non-light-emitting region 42a. Materials conventionally used for the n-electrode of the group III nitride semiconductor light-emitting device can be used for the n-electrode 50, and examples thereof include V/Al, Ti/Al, V/Au, Ti/Au and Ni/Au. The symbol "/" means lamination, and N/B means that A is film-formed, and B is then film-formed, and hereinafter the same. The present description means the structure of sequentially laminating from the n-type layer 43 side.

The group III nitride semiconductor light-emitting device of Example 1 has a structure that voltage is applied between a back surface electrode (not shown) provided on the support 10 back surface (the surface at a side opposite the joining layer 20 side), and the n-electrode 50 to achieve conduction in a direction vertical to the principal surface of the element, thereby emitting light, and light is extracted from the n-type layer 43 side. In the light emitted from the light-emitting layer 42, light emitted to the n-type layer 43 side is directly emitted to the outside, and light emitted to the p-type layer 41 side is reflected by the p-electrode 30 and emitted from the n-type layer 43 side. A region overlapping the n-electrode 50 in a planar view, of the light-emitting layer 42 is the non-light-emitting region 42a. As a result, the light emitted from the light-emitting layer 42 is inhibited from being reflected and absorbed by the n-electrode 50. Thus, the device of Example 1 has the structure that can extract light the n-electrode 50 side, efficiently.

Production process of the group III nitride semiconductor light-emitting device of Example 1 is described below by reference to FIG. 2.

(Formation Step of Semiconductor Layer 40)

Figure 2A:
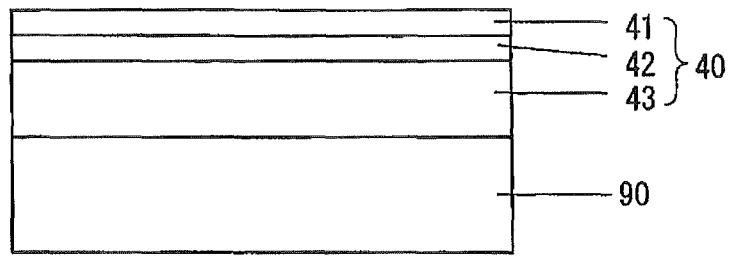
FIG. 2A is a view showing a production process of the group III nitride semiconductor light-emitting device of Example 1.

A sapphire substrate 90 is prepared, and thermal cleaning is conducted to remove impurities on the sapphire substrate 90 surface. The n-type layer 43, the light-emitting layer 42 and the p-type layer 41 comprising a group III nitride semiconductor are sequentially laminated on the sapphire substrate 90 through a buffer layer (not shown) comprising AlN by an MOCVD method to form the semiconductor layer 40 (FIG. 2A). Precursor used in the MOCVD method comprises ammonia ($NH_3$) as a nitrogen source, trimethyl gallium (Ga($CH_3$)$_3$) as a Ga source, trimethyl indium (In($CH_3$)$_3$) as an In source, trimethyl aluminum (Al($CH_3$)$_3$) as an Al source, silane ($SiH_4$) as an n-type doping gas, cyclopentadienyl magnesium (Mg($C_5H_5$)$_2$) as a p-type doping gas, and $H_2$ and $N_2$ are used for carrier gases. Other than the sapphire substrate 90, substrates such as SiC, ZnO, spinel and the like can be used as the growth substrate. After formation of the semiconductor layer 40, heat treatment is conducted in a nitrogen atmosphere to activate Mg, thereby converting the p-type layer 41 into p-type.

(Formation Step of P-Electrode 30)

Figure 2B:
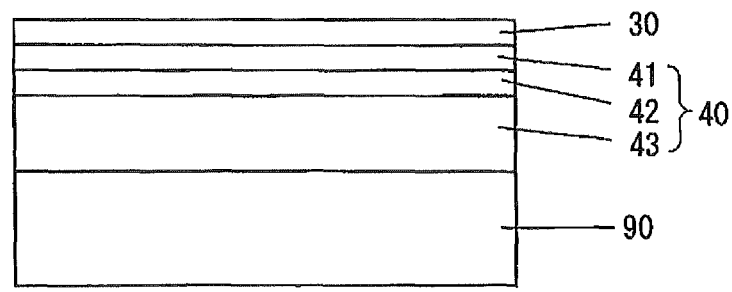
FIG. 2B is a view showing a production process of the group III nitride semiconductor light-emitting device of Example 1.

The p-electrode 30 is formed on the p-type layer 41 by a sputtering method (FIG. 2B). The p-electrode 30 may be formed by evaporation methods.

(Application Step of Ag Paste)

Ag paste is applied to a region on the p-electrode 30 and overlapping the n-electrode 50 being formed in the subsequent step in a planar view. The Ag paste comprises Ag particles mixed with and dispersed in a solvent. A material containing hydrogen as a constituent element, such as an epoxy resin, a silicone resin or an aliphatic higher alcohol can be used for the solvent. In particular, terpineol, decanol, diol and the like can be used as the aliphatic higher alcohol. The Ag particles may be covered with a dispersing material for preventing agglomeration of Ag particles. Average particle size of the Ag particles is optional, but Ag particles having an average particle size of from 30 to 500 nm is desirable from the standpoint of ease of agglomeration. Examples of the application method of the Ag paste that can be used include various printing methods such as screen printing, offset printing and inkjet printing, and methods such as dispenser, spin coating and spraying. Thickness from 0.5 to 2.0 μm of the Ag paste is desirable.

(Burning Step of Ag Paste)

Figure 2C:
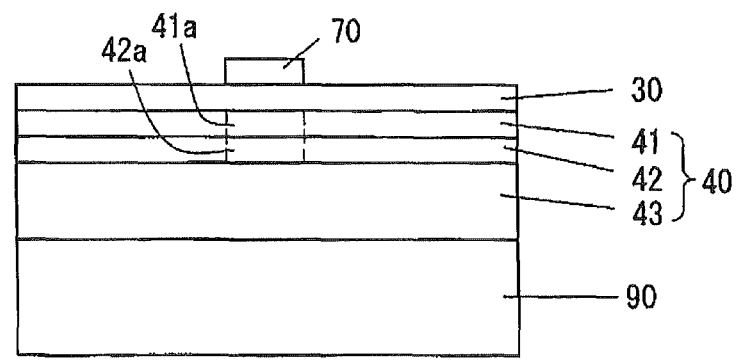
FIG. 2C is a view showing a production process of the group III nitride semiconductor light-emitting device of Example 1.

Heat treatment is conducted at 500° C. for 10 minutes in vacuum atmosphere or an oxygen atmosphere under a pressure of from 1 to 50 Pa. By the heat treatment, a solvent in the Ag paste is evaporated, and the Ag particles are agglomerated and solidified. Thus, the Ag paste solidified body 70 is formed (FIG. 2C).

The heat treatment conditions are not limited to the above, and the following conditions can be employed. The heat treatment atmosphere may be an inert gas such as helium, neon, argon, xenon or nitrogen. The atmosphere may further be a mixed atmosphere of oxygen and the inert gas. In particular, nitrogen is preferable from the standpoint of consistency with production process. The heat treatment temperature and time can be in the range that the Ag paste is solidified. The temperature and time depend on a material of the solvent of the Ag paste, and the like, but may be, for example, a range of from 300 to 600° C. and a range of from 5 to 30 minutes, respectively. The atmosphere pressure during the heat treatment is not limited to the above range of from 1 to 50 Pa. However, the pressure within the range can enhance evaporation of the solvent.

When the Ag paste solidified body 70 is formed by the heat treatment, a region overlapping the Ag paste solidified body 70 in a planar view, of the p-type layer 41 becomes to have high resistance, and the high resistance region 41a is formed. Therefore, a region overlapping the high resistance region 41a in a planar view, of the light-emitting layer 42 becomes the non-light-emitting region 42a. The reason that the high resistance region 41a is formed is considered to be that H (hydrogen) contained in the solvent of the Ag paste diffuses and becomes incorporated in the p-type layer 41, thereby inactivates Mg as p-type impurities.

(Joining Step of Support 10)

Figure 2D:
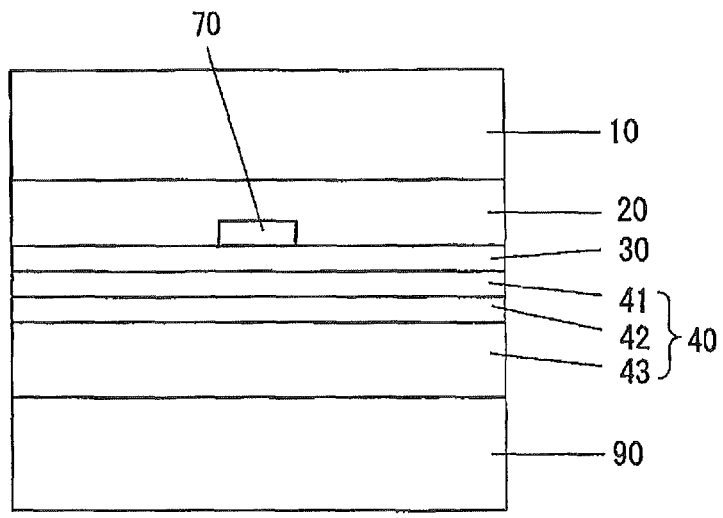
FIG. 2D is a view showing a production process of the group III nitride semiconductor light-emitting device of Example 1.

The joining layer 20 is formed on the entire surfaces of the p-electrode 30 and the Ag paste solidified body 70. A diffusion blocking layer is desirably formed between the p-electrode 30 and the joining layer 20 and between the Ag paste solidified body 70 and the joining layer 20 in order to prevent diffusion of a metal element constituting the joining layer 20 into the p-electrode 30 and the n-type layer 41. A multilayer film containing Ti/Ni, such as Ti/Ni/Au, and a multilayer film containing W/Pt, such as W/Pt/Au can be used for the diffusion blocking layer. The support 10 is prepared, and the support and the p-electrode 30 are joined through the joining layer 20 (FIG. 2D). In this case, the joining layer 20 is formed on one surface of the support 10, and the joining layer 20 on the support 10 is joined with the joining layer 20 on the p-electrode 30, and the assembly is heat-pressed, thereby joining the support 10 and the p-electrode 30.

(Laser Lift-Off Step)

Figure 2E:
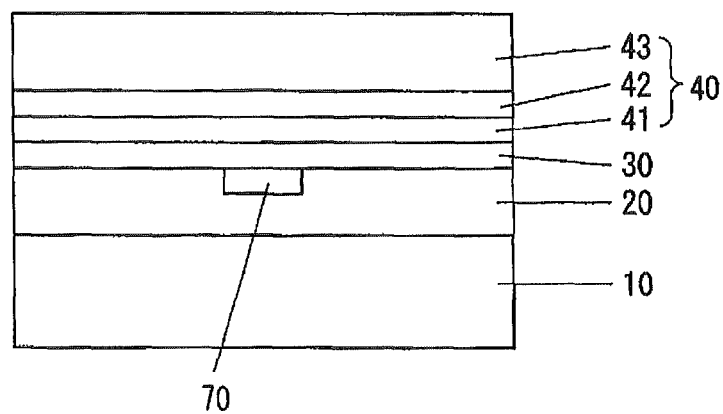
FIG. 2E is a view showing a production process of the group III nitride semiconductor light-emitting device of Example 1.

The sapphire substrate 90 is separated and removed by laser lift-off (FIG. 2E). Specifically, laser light having a wavelength that penetrates sapphire and is absorbed by a group III nitride semiconductor (for example, excimer laser such as KrF) is irradiated from the sapphire substrate 90 side to decompose the semiconductor layer 40 in the vicinity of the interface between the sapphire substrate 90 and the semiconductor layer 40, thereby the sapphire substrate 90 is peeled off and removed from the semiconductor layer 40.

(Formation Step of Concavo-Convex Shape 44)

Figure 2F:
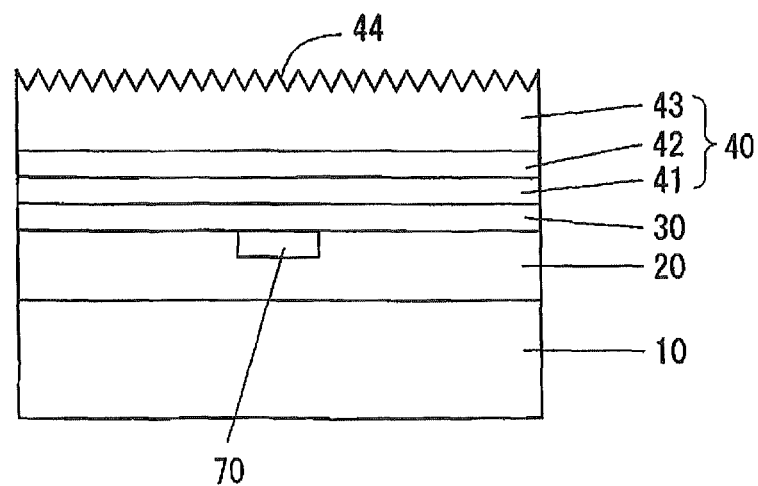
FIG. 2F is a view showing a production process of the group III nitride semiconductor light-emitting device of Example 1.

The surface of the n-type layer 43 is wet-etched by a TMAH aqueous solution to form the concavo-convex shape 44 on the surface of the n-type layer 43 (FIG. 2F). KOH, NaOH, phosphoric acid and the like other than TMAH can be used for the wet etching.

(Formation Step of Transparent Electrode 60)

Figure 2G:
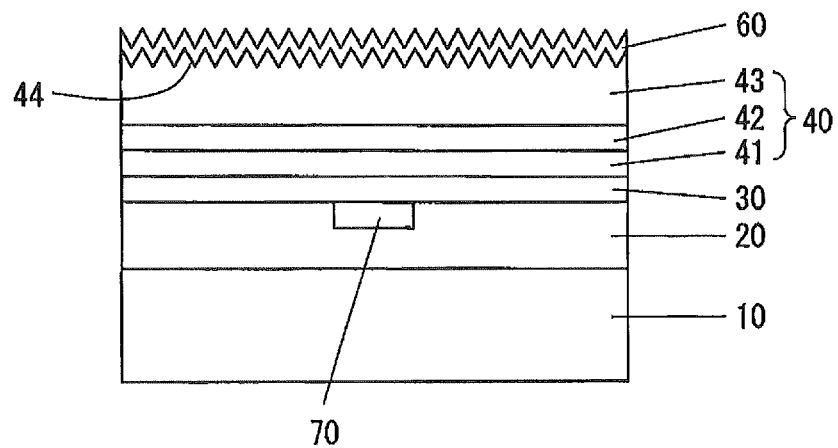
FIG. 2G is a view showing a production process of the group III nitride semiconductor light-emitting device of Example 1.

The transparent electrode 60 is formed on the entire surface of the n-type layer 43 having the concavo-convex shape 44 by sputtering (FIG. 2G). The transparent electrode 60 may be formed by evaporation deposition other than sputtering.

(Formation Step of N-Electrode 50)

The n-electrode 50 is formed on a region on the transparent electrode 60 and overlapping the Ag paste solidified body 70 in a planar view using sputtering or evaporation deposition, and a lift-off method. Specifically, the n-electrode 50 is formed on the upper part of the non-light-emitting region 42a. The support 10 is polished to decrease its thickness, a back surface electrode (not shown) is formed on the back surface of the support 10, and device separation is conducted by laser dicing, scribing or the like. The group III nitride semiconductor light-emitting device of Example 1 shown in FIG. 1 is produced by the above steps.

According to this method for producing the group III nitride semiconductor light-emitting device of Example 1, a desired region of the light-emitting layer 42, that is, a region overlapping the n-electrode 50 in a planar view, can easily be formed into the non-light-emitting region 42, and light extraction efficiency can be improved.

Example 2

Figure 3:
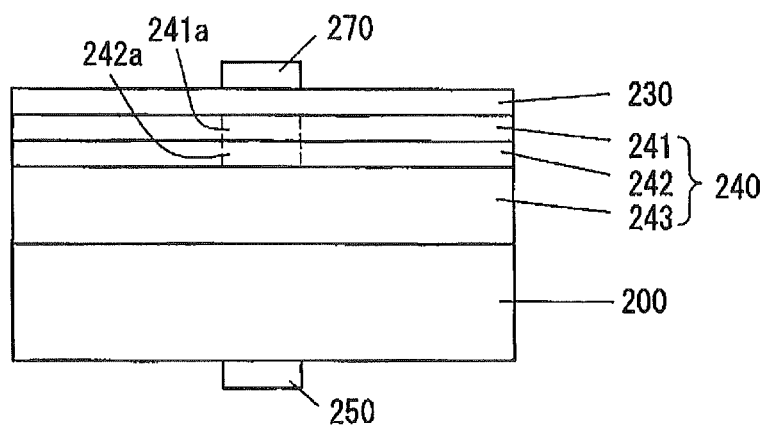
FIG. 3 is a view showing a constitution of the group III nitride semiconductor light-emitting device of Example 2.

FIG. 3 is a view showing a constitution of the group III nitride semiconductor light-emitting device of Example 2. The group III nitride semiconductor light-emitting device of Example 2 comprises an n-type GaN substrate 200, and a semiconductor layer 240 comprising a group III nitride semiconductor, positioned on the GaN substrate 200. In the semiconductor layer 240, three layers of an n-type layer 243, a light-emitting layer 242 and a p-type layer 241 are sequentially laminated from the GaN substrate 200 side. An n-electrode 250 is provided on a back surface of the GaN substrate 200 (the surface at an opposite side of the semiconductor layer 240 side). A p-electrode 230 is provided on the nearly entire area of the surface of the p-type layer 241 (the surface at an opposite side of the light-emitting layer 242 side). An Ag paste solidified body 270 is provided on a region overlapping the n-electrode in a planar view on the p-electrode 230.

The constitution of the semiconductor layer 240 can be the same constitution as the semiconductor layer 40 of the group III nitride semiconductor light-emitting layer of Example 1. Materials of the p-electrode 230 and the n-electrode 250 can use the same materials as the p-electrode 30 and the n-electrode 50 of the group III nitride semiconductor light-emitting device of Example 1. A transparent electrode may be provided between the back surface of the GaN substrate and the n-electrode 250, to improve current diffusibility. The Ag paste solidified body 270 is one obtained by solidifying the same Ag paste as in Example 1. Instead of the GaN substrate 200, a substrate that is transparent to an emission wavelength of the group III nitride semiconductor light-emitting device, has conductivity and has a lattice constant near that of the group III nitride semiconductor can be used. Such a substrate include, for example, group III nitride semiconductors other than GaN, or a substrate comprising ZnO, $Ga_2O_3$, SiC or the like.

A high resistance region 241a is formed in a region overlapping the n-electrode 250 and the Ag paste solidified body 270 in a planar view, of the p-type layer 241. As a result, even though forward voltage is applied between the p-electrode 230 and the n-electrode 250, current does not flow a region overlapping the high resistance region 241a in a planar view, of the light-emitting layer 242, and such a region constitutes a non-light-emitting region 242a.

The group III nitride semiconductor light-emitting device of Example 2 has a structure in which voltage is applied between the p-electrode 230 and the n-electrode 250 to achieve conduction in a direction normal to the principal surface of the device and emits light, and light is extracted from the n-type layer 243 side. In the light emitted from the light-emitting layer 242, light emitted to the n-type layer 243 side is directly emitted to the outside, and light emitted to the p-type layer 241 side is reflected by the p-electrode 230 and emitted from the n-type layer 243 side. A region overlapping the n-electrode 250 in a planar view, of the light-emitting layer 242 is the non-light-emitting region 242a. Therefore, light is inhibited from being reflected and absorbed by the n-electrode 250. As a result, light extraction efficiency is improved.

Production process of the group III nitride semiconductor light-emitting device of Example 2 is described below by reference to FIG. 4.

(Formation Step of Semiconductor Layer 240)

Figure 4A:
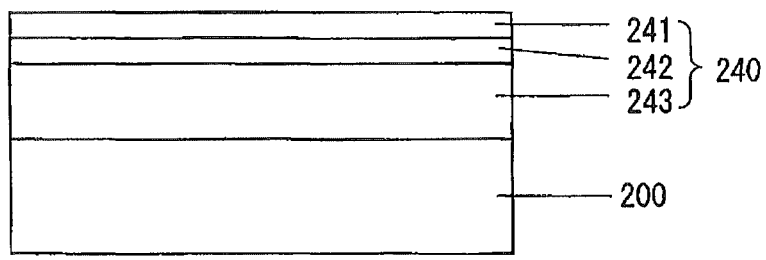
FIG. 4A is a view showing a production process of the group III nitride semiconductor light-emitting device of Example 2.

The n-type GaN substrate 200 is prepared, and the n-type layer 243, the light-emitting layer 242 and the p-type layer 241 comprising a group III nitride semiconductor are sequentially laminated on the GaN substrate 200 by an MOCVD method to form the semiconductor layer 240 (FIG. 4A). Precursor used in the MOCVD method is the same as those used during the formation of the semiconductor layer 40 of the group III nitride semiconductor light-emitting device of Example 1. After formation of the semiconductor layer 240, heat treatment is conducted in a nitrogen atmosphere to activate the p-type layer 241.

(Formation Step of P-Electrode 230)

Figure 4B:
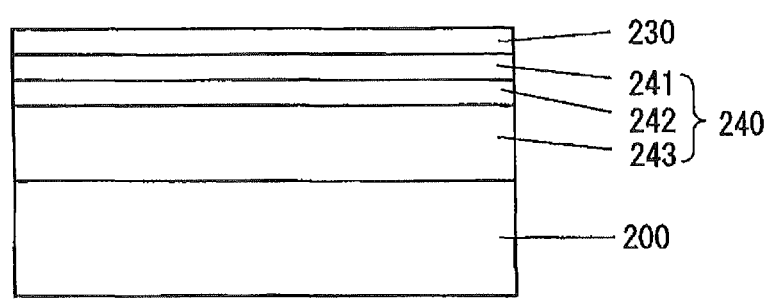
FIG. 4B is a view showing a production process of the group III nitride semiconductor light-emitting device of Example 2.

The p-electrode 230 is formed on the nearly entire surface of the p-type layer 241 by a sputtering method (FIG. 4B). The p-electrode 230 may be formed by evaporation vacuum deposition method instead of the sputtering method.

(Application Step of Ag Paste)

An Ag paste is applied to a region overlapping the n-electrode 250 subsequently formed, in a planar view on the p-electrode 230. Material and application method of the Ag paste are the same as those of the Ag paste of Example 1.

(Burning Step of Ag Paste)

Figure 4C:
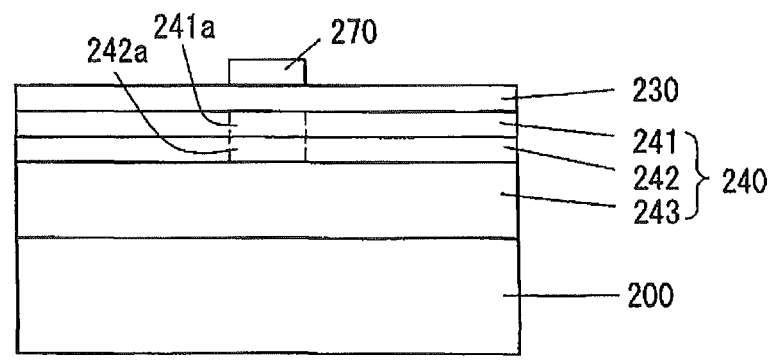
FIG. 4C is a view showing a production process of the group III nitride semiconductor light-emitting device of Example 2.

The Ag paste is heat-treated to solidify, thereby forming the Ag paste solidified body 270 (FIG. 4C). Various conditions of the heat treatment are the same as the heat treatment conditions in the Ag paste burning step of Example 1.

When the Ag paste solidified body 270 is formed by the heat treatment, a region overlapping the Ag paste solidified body 270 in a planar view, of the p-type layer 241 is formed into a region having high resistance, and the high resistance region 241a is formed. As a result, a region overlapping the high resistance region 241a in a planar view, of the light-emitting layer 242 constitutes the non-light-emitting region 242a.

(Formation Step of N-Electrode 250)

The n-electrode 250 is formed on a region that is a back surface of the GaN substrate 200 and overlaps the Ag paste solidified body 270 in a planar view, using sputtering or evaporation, and a lift-off method. Thus, the group III nitride semiconductor light-emitting device of Example 2 shown in FIG. 3 is produced.

According to the method for producing the group III nitride semiconductor light-emitting device of Example 2, a region overlapping the n-electrode 250 in a planar view, of the light-emitting layer 242 can easily be formed into the non-light-emitting region 242a, thereby inhibiting reflection and absorption of light by the n-electrode 250. As a result, light extraction efficiency can be improved.

Example 3

Figure 5:
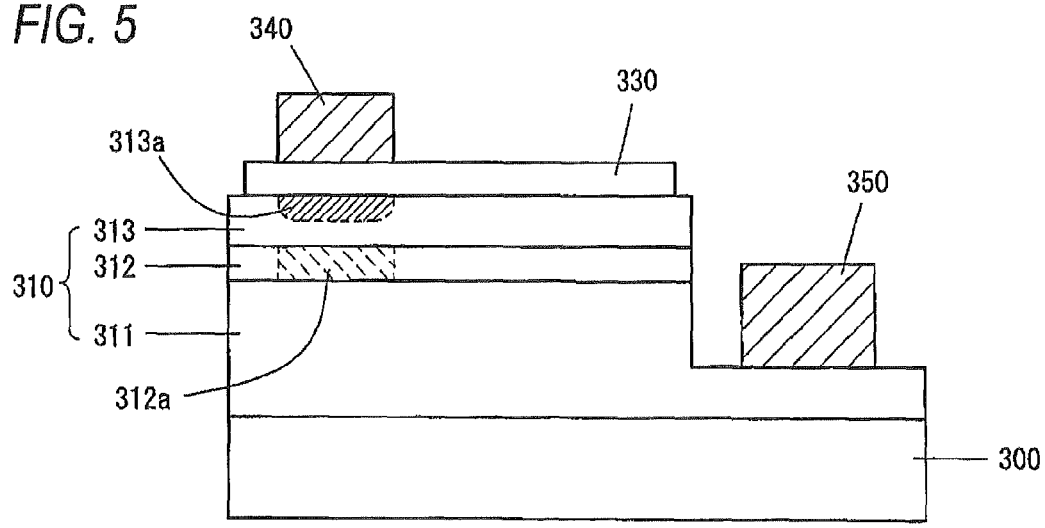
FIG. 5 is a view showing a constitution of the group III nitride semiconductor light-emitting device of Example 3.

FIG. 5 is a view showing a constitution of the group III nitride semiconductor light-emitting device of Example 3. The group III nitride semiconductor light-emitting device of Example 3 is a face-up type, and comprises a sapphire substrate 300 as a growth substrate, and a semiconductor layer 310 comprising a group III semiconductor, positioned on the sapphire substrate 300. In the semiconductor layer 310, three layers of an n-type layer 311, a light-emitting layer 312 and a p-type layer 313 are sequentially laminated from the sapphire substrate 300 side. A part of the semiconductor layer 310 is etched and removed to form a groove, and the n-type layer 311 is exposed on the bottom of the groove. An n-electrode 350 is formed on the exposed n-type layer 311. A transparent electrode 330 comprising ITO (indium-tin oxide) is provided on the nearly entire area of the surface of the p-type layer 313 (the surface at a side opposite the light-emitting layer 312 side). A p-pad electrode 340 that is an Au paste solidified body is formed on a part of the region on the transparent electrode 330.

The p-pad electrode 340 comprises an Au paste having been solidified by heat treatment. The Au paste comprises Au particles mixed with and dispersed in the same solvent of the Ag paste of Examples 1 and 2. Instead of ITO, IZO (indium-zinc oxide), ICO (indium-cerium oxide) or the like can be used for the transparent electrode 330.

A high resistance region 313a is formed in a region overlapping the p-pad electrode 340 in a planar view, of the p-type layer 313. As a result, even though forward voltage is applied between the p-pad electrode 340 and the n-electrode 350, current does not flow a region overlapping the high resistance region 313a in a planar view, of the light-emitting layer 312, and the region becomes a non-light-emitting region 312a.

The group III nitride semiconductor light-emitting device of Example 3 has a structure in which voltage is applied between the p-pad electrode 340 and the n-electrode 350 to achieve conduction in a direction of the principal surface of the device and to emit light, and light is extracted from the p-pad electrode 340 and the n-electrode 350 side. The region overlapping the p-pad electrode 340 in a planar view, of the light-emitting layer 312 is the non-light-emitting region 312a. Therefore, the light is inhibited from being reflected and absorbed by the p-pad electrode 340. As a result, light extraction efficiency is improved.

Production process of the group III nitride semiconductor light-emitting device of Example 3 is described below by reference to FIG. 6.

Formation Step of Semiconductor Layer 310

Figure 6A:
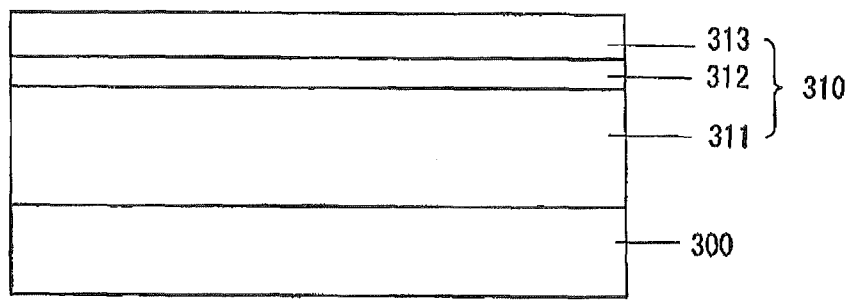
FIG. 6A is a view showing a production process of the group III nitride semiconductor light-emitting device of Example 3.

The sapphire substrate 300 is prepared, and the n-type layer 311, the light-emitting layer 312 and the p-type layer 313 comprising a group III nitride semiconductor, are sequentially laminated on the sapphire substrate 300 by an MOCVD method, thereby forming the semiconductor layer 310 (FIG. 6A). Raw material gas used in the MOCVD method is the same as that used during the formation of the semiconductor layer 40 of the group III nitride semiconductor light-emitting element of Example 1. After formation of the semiconductor layer 310, heat treatment is conducted in a nitrogen atmosphere to activate the p-type layer 313.

(Formation Step of Transparent Electrode 330)

Figure 6B:
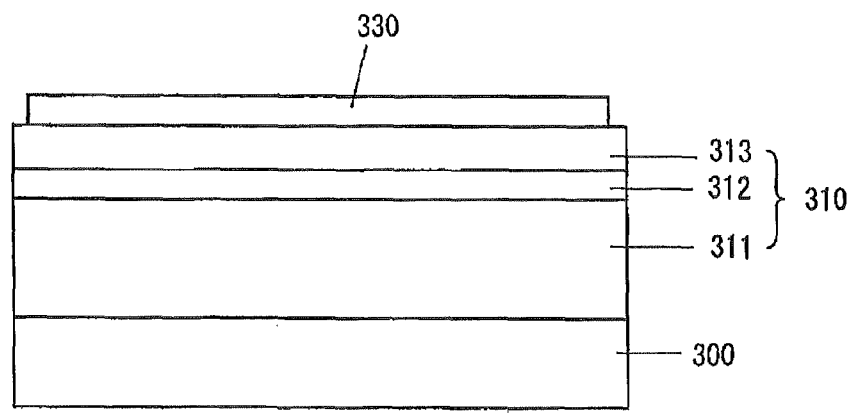
FIG. 6B is a view showing a production process of the group III nitride semiconductor light-emitting device of Example 3.

The transparent electrode 330 comprising ITO is formed on the nearly entire area of the surface of the p-type layer 313 by evaporation deposition or sputtering (FIG. 6B).

(Formation Step of N-Electrode 350)

Figure 6C:
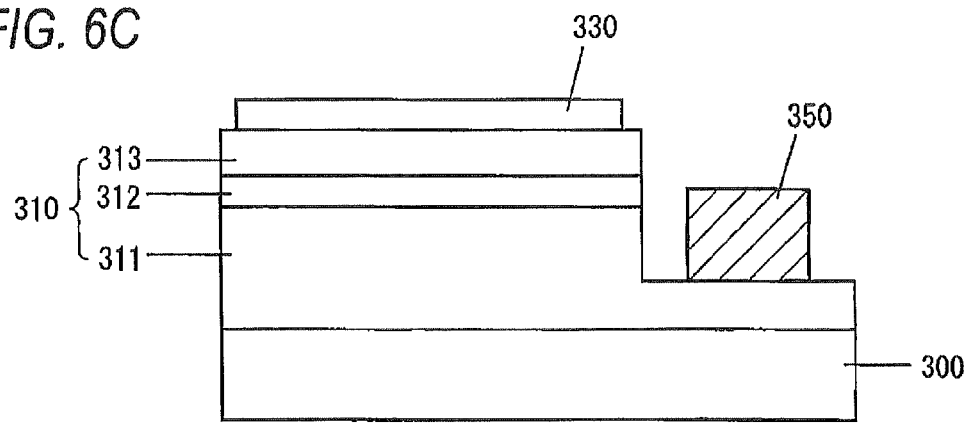
FIG. 6C is a view showing a production process of the group III nitride semiconductor light-emitting device of Example 3.

Grooves reaching the n-type layer 311 from the transparent electrode 330 side are formed in appointed regions by dry etching. The n-electrode 350 is formed on the n-type layer 311 exposed on the bottom of the groove using evaporation deposition or sputtering, and a lift-off method (FIG. 6C).

(Formation Step of P-Pad Electrode 340)

Figure 6D:
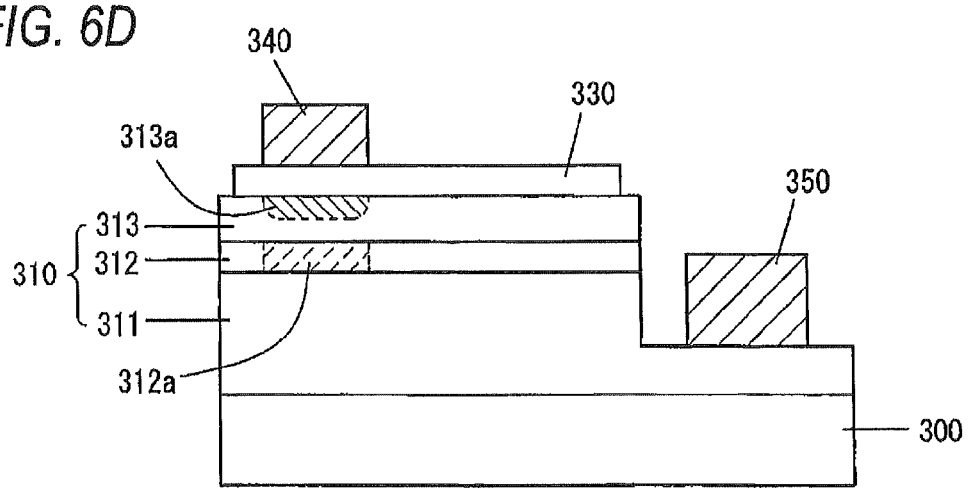
FIG. 6D is a view showing a production process of the group III nitride semiconductor light-emitting device of Example 3.

An Au paste is applied to an appointed region on the transparent electrode 330. The Au paste comprises Au particles dispersed in the same solvent as the solvent for Ag paste of Example 1. Application method of the Au paste is the same as in the Ag paste of Example 1. Heat treatment is conducted to solidify the Au paste, and the solidified Au paste constitutes the p-pad electrode 340 (FIG. 6D). Various conditions of the heat treatment are the same as the heat treatment conditions in the Ag paste burning step of Example 1.

When the Au paste is solidified by the heat treatment, a region overlapping the p-pad electrode 340 that is the solidified Au paste in a planar view, of the p-type layer 313 forms a region having high resistance, and the high resistance region 313a is formed. As a result, a region overlapping the high resistance region 313a in a planar view, of the light-emitting layer 312 becomes the non-light-emitting region 312a.

According to the method for producing the group III nitride semiconductor light-emitting device of Example 3, the high resistance region 313a can be formed in a region overlapping the p-pad electrode 340 in a planar view, of the p-type layer 313, and the p-pad electrode 340 can be formed simultaneously. As a result, as compared with the conventional production method in which an insulating layer or the like has been formed to form a high resistance region, the number of steps can be reduced, and as a result, production costs can be reduced.

In Examples 1 and 2, all region of the n-electrode is not necessary to overlap the non-light-emitting layer in a planar view, and only a part of the region of the n-electrode may overlap the non-light-emitting region. In this case, the overlapped region is inhibited from reflection and absorption of light by the n-electrode, and as a result, light extraction efficiency can be improved. For example, in the case that the n-electrode 50 is constituted of a pad part that is a connecting part to a bonding wire, and a wire-shaped part extending in a wire shape from the pad part, only the pad part may overlap the non-light-emitting region 42a, and the wire-shaped part may overlap a light-emitting region. However, to further improve light extraction efficiency, it is desirable to overlap all region of the n-electrode with the non-light-emitting region.

In Example 1, laser lift-off is used to remove the sapphire substrate that is a growth substrate. However, chemical lift-off method, in which a buffer layer that can be dissolved in a chemical is formed between the sapphire substrate and the n-type layer and the sapphire substrate can be separated and removed by dissolving the buffer layer by the chemical after joining to the support can be used.

To form the high resistance region in the p-type layer, Examples 1 and 2 can be used in an Ag paste, and Example 3 can be used in an Au paste. However, any metal paste having been mixed with and dispersed in a solvent can be used so long as it is a metal paste comprising metal particles comprising optional material having conductivity. It is considered that a solvent comprising a material containing hydrogen as a constituent element contributes to the formation of the high resistance region. The metal paste solidified body after formation of the high resistance region is sufficient if it has conductivity. For example, a Cu paste having Cu particles mixed and dispersed therein may be used.

The group III nitride semiconductor light-emitting device produced by the present invention can be utilized in lighting devices and display devices.

What is claimed is:

1. A method for producing a group III nitride semiconductor light-emitting device having a part of a region of a light-emitting layer as a non-light-emitting region, the method comprising:
sequentially laminating an n-type layer, a light-emitting layer and a p-type layer comprising a group III nitride semiconductor on a growth substrate;
activating the p-type layer to p-type activation by heat treatment and then forming a p-contact electrode on the p-type layer;
applying a metal paste comprising conductive metal particles dispersed in a solvent comprising a material containing hydrogen as a constituent element, to a desired region on the p-contact electrode; and
solidifying the metal paste by heat treatment to form a part of a region of the p-type layer into a high resistance region, thereby forming a region overlapping a region having the metal paste applied thereto in a planar view, of the light-emitting layer into a non-light-emitting region.

2. The method for producing a group III nitride semiconductor light-emitting device according to claim 1, wherein the p-contact electrode comprises Ag or an Ag alloy, and
the method further comprises:
joining the support and the p-contact electrode and removing the growth substrate using a substrate lift-off method after the solidifying, and
forming an n-electrode in a region that is the surface of the n-type layer exposed by removal of the growth substrate and overlaps the region having the metal paste applied thereto in a planar view after the joining.

3. The method for producing a group III nitride semiconductor light-emitting device according to claim 1,
wherein the growth substrate comprises a transparent conductive substrate,
the p-contact electrode comprises Ag or an Ag alloy, and
the method further comprises:
forming an n-electrode on a region that is a surface at a side opposite the n-type layer formation side of the growth substrate and overlaps a region having the metal paste applied thereto in a planar view after the solidifying.

4. The method for producing a group III nitride semiconductor light-emitting device according to claim 1, wherein the group III nitride semiconductor light-emitting element comprises a face-up type,
the p-contact electrode comprises a transparent electrode comprising a transparent conductive material, and
a solidified metal paste solidified in the solidifying the metal paste is used as a p-pad electrode.

5. The method for producing a group III nitride semiconductor light-emitting device according to claim 1, wherein the solvent of the metal paste comprises an epoxy resin, a silicone resin or an aliphatic higher alcohol.

6. The method for producing a group III nitride semiconductor light-emitting device according to claim 1, wherein the metal particles comprise Ag, Cu or Au.

7. The method for producing a group III nitride semiconductor light-emitting device according to claim 1, wherein the heat treatment of the solidifying the metal paste is conducted in an oxygen atmosphere, an inert gas atmosphere or a mixed atmosphere of those under a pressure of from 1 to 50 Pa.

8. The method for producing a group III nitride semiconductor light-emitting device according to claim 7, wherein the heat treatment of the solidifying the metal paste is conducted in an oxygen atmosphere, a nitrogen atmosphere or a mixed atmosphere of those.

9. A group III nitride semiconductor light-emitting device, comprising:
a conductive support;
a p-electrode comprising Ag or an alloy containing Ag, positioned on the support;
a p-type layer, a light-emitting layer and an n-type layer comprising a group III nitride semiconductor, sequentially positioned on the p-electrode; and
an n-electrode positioned on the n-type layer,
wherein a region that is a surface at the support side of the p-electrode and overlaps the n-electrode in a planar view has a solidified metal paste that comprises a solid of a metal paste, and
wherein a region overlapping the solidified metal paste in a planar view, of the p-type layer comprises a high resistance region.

10. A group III nitride semiconductor light-emitting device, comprising:
a transparent conductive substrate;
an n-type layer, a light-emitting layer and a p-type layer comprising a group III nitride semiconductor, sequentially positioned on the transparent conductive substrate;
a p-electrode comprising Ag or an alloy containing Ag, positioned on the p-type layer; and
an n-electrode positioned on a surface at a side opposite the n-type layer side of the transparent conductive substrate,
wherein a region on the p-electrode and overlapping the n-electrode in a planar view has a solidified metal paste that comprises a solid of the metal paste, and
a region overlapping the solidified metal paste in a planar view, of the p-type layer comprises a high resistance region.

11. A face-up-type group III nitride semiconductor light-emitting element, comprising:
a growth substrate;
an n-type layer, a light-emitting layer and a p-type layer comprising a group III nitride semiconductor, sequentially positioned on the growth substrate;
a semiconductor layer in which a part of the semiconductor layer is etched from the p-type layer side and a surface of the n-type layer is exposed;
an n-electrode positioned on the exposed n-type layer;
a transparent electrode positioned on the p-type layer; and
a p-pad electrode positioned on the transparent electrode,
wherein the p-pad electrode comprises a solidified metal paste, and
a region overlapping the p-pad electrode in a planar view, of the p-type layer comprises a high resistance region.

12. The group III nitride semiconductor light-emitting device according to claim 9, wherein the solidified metal paste is obtained by burning a metal paste comprising metal particles comprising Ag, Cu or Au dispersed in a solvent comprising a material containing hydrogen as a constituent element, and then solidifying the same.

13. The group III nitride semiconductor light-emitting device according to claim 10, wherein the solidified metal paste is obtained by burning a metal paste comprising metal particles comprising Ag, Cu or Au dispersed in a solvent comprising a material containing hydrogen as a constituent element, and then solidifying the same.

14. The group III nitride semiconductor light-emitting device according to claim 11, wherein the solidified metal paste is obtained by burning a metal paste comprising metal particles comprising Ag, Cu or Au dispersed in a solvent comprising a material containing hydrogen as a constituent element, and then solidifying the same.

15. The group III nitride semiconductor light-emitting device according to claim 9, further comprising:
    a joining layer positioned between the p-electrode and the support,
    wherein the solidified metal paste is provided on the joining layer side of the p-electrode.

16. The group III nitride semiconductor light-emitting device according to claim 9,
    wherein the p-type layer contacts a surface of the p-electrode.

17. The group III nitride semiconductor light-emitting device according to claim 9,
    wherein the solidified metal paste is provided on an opposite side of the p-electrode as the p-type layer.

18. The group III nitride semiconductor light-emitting device according to claim 10,
    wherein a region that is a surface on the p-electrode opposite the p-type layer has the solidified metal paste.

19. The group III nitride semiconductor light-emitting device according to claim 11,
    wherein the high resistance region is below the transparent electrode.

20. The group III nitride semiconductor light-emitting device according to claim 11,
    wherein p-type layer, the transparent electrode, and the p-pad electrode are sequentially positioned on the transparent electrode.

\* \* \* \* \*